United States Patent [19]

Okuda et al.

[11] Patent Number: 4,792,052

[45] Date of Patent: Dec. 20, 1988

[54] APPARATUS FOR CONTROLLING THE NUMBER OF REVOLUTIONS OF AN ENGINE

[75] Inventors: Junji Okuda; Kazunori Hashi, both of Hiratsuka; Kentaro Nakamura, Fujisawa; Kazuo Kubo, Hiratsuka, all of Japan

[73] Assignee: Kabushiki Kaisha Komatsu Seisakusho, Japan

[21] Appl. No.: 893,013

[22] Filed: Aug. 4, 1986

[30] Foreign Application Priority Data

Dec. 17, 1985 [JP] Japan .................................. 60-283768

[51] Int. Cl.⁴ .............................................. B66C 15/00
[52] U.S. Cl. .................................... 212/162; 212/153; 212/159; 212/163; 123/342; 123/198 D; 180/272
[58] Field of Search ............ 123/342, 198 D, 198 DB, 123/198 DC, 319, 377; 414/694; 180/272; 212/149, 150, 153, 155, 159, 162, 163, 164, 165

[56] References Cited

U.S. PATENT DOCUMENTS

| | | | |
|---|---|---|---|
| 3,202,161 | 8/1965 | Richards | 123/198 D |
| 3,690,387 | 9/1972 | Dixon | 212/163 |
| 3,722,707 | 3/1973 | Hedeen et al. | 212/152 |
| 3,845,847 | 11/1974 | Camp | 123/198 DC |
| 3,946,288 | 3/1976 | Isaksson et al. | 180/272 |
| 4,371,051 | 2/1983 | Achterholt | 180/271 |
| 4,427,121 | 1/1984 | Clements | 212/159 |
| 4,596,508 | 6/1986 | Kishi et al. | 414/694 |
| 4,643,146 | 2/1987 | Spriessler | 414/699 |

FOREIGN PATENT DOCUMENTS 102729 8/1980 Japan .................................. 180/272

Primary Examiner—Sherman D. Basinger
Assistant Examiner—Thomas J. Brahan
Attorney, Agent, or Firm—Welsh & Katz, Ltd.

[57] ABSTRACT

An apparatus including a grip sensor for controlling the number of revolutions of an engine. The grip sensor detects whether or not fingers of an operator approach toward the grip sensor or the former come in contact with the latter. Usually, the grip sensor is incorporated in the gripping portion of a control lever which controls actuation of working tools. The apparatus includes a controller for outputting a deceleration signal in response to an output signal from the grip sensor in order to reduce the current number of revolutions of the engine to a level lower than the number of revolutions of the engine in the high operative state when no detection is achieved by means of the grip sensor. Alternatively, the controller may output an acceleration signal in response to an output signal from the grip sensor in order to raise the current number of revolutions of the engine to a level higher than that the engine in the idle rotational state when detection is achieved by means of the grip sensor.

16 Claims, 11 Drawing Sheets

APPARATUS FOR CONTROLLING THE NUMBER OF REVOLUTIONS OF AN ENGINE

BACKGROUND OF THE INVENTION

1. Field of the Invention

The present invention relates to an apparatus of the type including a grip sensor for controlling the number of revolutions of an engine and more particularly to an apparatus for controlling the number of revolutions of an engine mounted on a construction machine such as power shovel, wheel loader in dependence on the working condition of the construction machine.

2. Description of the Prior Art

A construction machine such as power shovel or the like performs digging operation, loading operation or the like while the number of revolutions of an engine mounted thereon is kept at a certain fixed level corresponding to an idle operative state that is set to a high level. On the other hand, a construction machine such as crane, wheel loader or the like is so constructed that the number of revolutions of an engine mounted thereon is adjusted by the depression of an acceleration pedal so as to control speed of operation when working, according to the power required for performing the operation.

However, it has been pointed out in problems with respect to the conventional operation of the power shovel that due to existence of inoperative periods of time such as when waiting for the arrival of a dump truck or the like, the rate of fuel consumption increases when the number of revolutions of an engine is kept at a fixed level corresponding to the high idle operative state. Moreover a noise level is maintained at a high level during the waiting time in which no field operation is performed. However, it is very troublesome for an operator to reduce the number of revolutions of an engine to a lower level by lowering the idle operative state with the use of a fuel adjusting lever each time no field operation is being performed.

In the case of crane, wheel loader or the like, adjusting of an extent of acceleration in dependence on the current state of load is troublesome for an operator and it is often found that engine trouble takes place when an extent of acceleration is not determined properly. In view of the facts as mentioned above, there have already been some proposal such as presetting the number of revolutions of an engine in an idle state to a higher level, modification of engine performances of engine torque and horse power. However, when the number of revolutions of an engine is raised up during idle operative state, the same incovenience takes place as in the case of power shovel.

As is hitherto known, power shovel or the like construction machine is provided with an automatic deceleration device which is intended to reduce the number of revolutions of an engine to a level lower than a predetermined number of revolutions by actuating a fuel adjusting lever during inoperative time, that is, during no load operation of the engine in order to reduce fuel consumption and prevent generation of noisy sound.

However, since the automatic deceleration device includes a limit switch for mechanically detecting the running state of power shovel and the neutral state of control levers for controlling actuation of working tools such as bucket or the like so as to detect an inoperative state where an operator does not operate power shovel and moreover it includes a pressure switch for detecting lower pressure state of supplied hydraulic oil (inoperative state of the control levers) in association with actuation of the control levers, the number of revolutions of an engine is automatically caused to decrease when the control levers are shifted to the neutral position, in spite of the fact that an operator still intends to continue the operation. This means that function of the automatic deceleration device conflicts with labor intention of an operator.

In the case of a construction machine such as crane, wheel loader or the like which is so constructed that the number of revolutions of an engine mounted thereon is adjusted as required by selectively determining an extent of depressing of an acceleration pedal, there has not been made any proposal as to how the number of revolutions of the engine is automatically controlled in dependence on the existent operative state.

SUMMARY OF THE INVENTION

Thus, the present invention has been made with the foregoing background in mind and its object resides in providing an apparatus of the type including at least a grip sensor for controlling the number of revolutions of an engine which assures good starting capability and maneuverability of a working tools such as bucket or the like, reduction of fuel consumption during inoperative state and prevention of generation of noisy sound by reducing the number of revolutions of the engine when an operator has no intention to continue the operation but raising the number of revolutions of the engine when he has any intention to continue the operation.

To accomplish the above object there is proposed according to one aspect of the present invention an apparatus for controlling the number of revolutions of an engine comprising at least a grip sensor incorporated in the gripping portion of a control lever adapted to control actuation of a working tool on a construction machine or the like, the grip sensor detecting whether or not the body of an operator approaches toward the gripping portion of the control lever or the former comes in contact with the latter, control means adapted to output a deceleration signal in response to an output signal from the grip sensor in order to reduce the current number of revolutions of the engine to a level lower than the number of revolutions of the engine in an idle rotational state that is set to a high level, the output signal indicating that no detection is achieved, and driving means for reducing the number of revolutions of the engine to a level of the last-mentioned one in response to the deceleration signal from the control means.

Further, there is proposed according to other aspect of the present invention an apparatus for controlling the number of revolutions of an engine comprising at least a grip sensor incorporated in the gripping portion of a control lever adapted to control actuation of a working tool on a construction machine or the like, the grip sensor detecting whether or not the body of an operator approaches toward the gripping portion of the control lever or the former comes n contact with the latter, control means adapted to output an acceleration signal in response to an output signal from the grip sensor in order to raise the current number of revolutions of the engine to a level higher than the number of revolutions of the engine in the idle rotational state, the output signal indicating that detection is achieved, and driving means for raising the number of revolutions of the engine to a level of the last-mentioned one in response to the acceleration signal from the control means.

In the case of a construction machine of the type which is so constructed that at least a grip sensor for detecting whether the body of an operator approaches towards a control lever or the former comes in contact with the latter is incorporated in the gripping portion of the control lever adapted to control actuation of a working tool on the construction machine and field operation is performed while the number of revolutions of the engine is kept at a fixed level corresponding to the high idle rotational state, the current number of revolutions of the engine is automatically reduced to a level lower than that corresponding to the high idle rotational state in response to an output signal from the gripper sensor which indicates that no detection is achieved. On the other hand, in the case of a construction machine of the type which is so constructed that the number of revolutions of the engine is adjusted as required by selectively determining an extent of depressing of an acceleration pedal, the number of revolutions of an engine corresponding to the idle rotational state is set at a lower level and it is then automatically raised to a higher level in response to an output signal from the grip sensor which indicates that detection is achieved.

Other objects, features and advantages of the present invention will become readily apparent from reading of the following description which has been prepared in conjunction with the accompanying drawings.

BRIEF DESCRIPTION OF THE DRAWINGS

The accompanying drawings will be briefly described below.

DESCRIPTION OF THE PREFERRED EMBODIMENTS

Now, the present invention will be described in a greater detail hereunder with reference to the accompanying drawings which illustrate preferred embodiments thereof.

Figure 1:
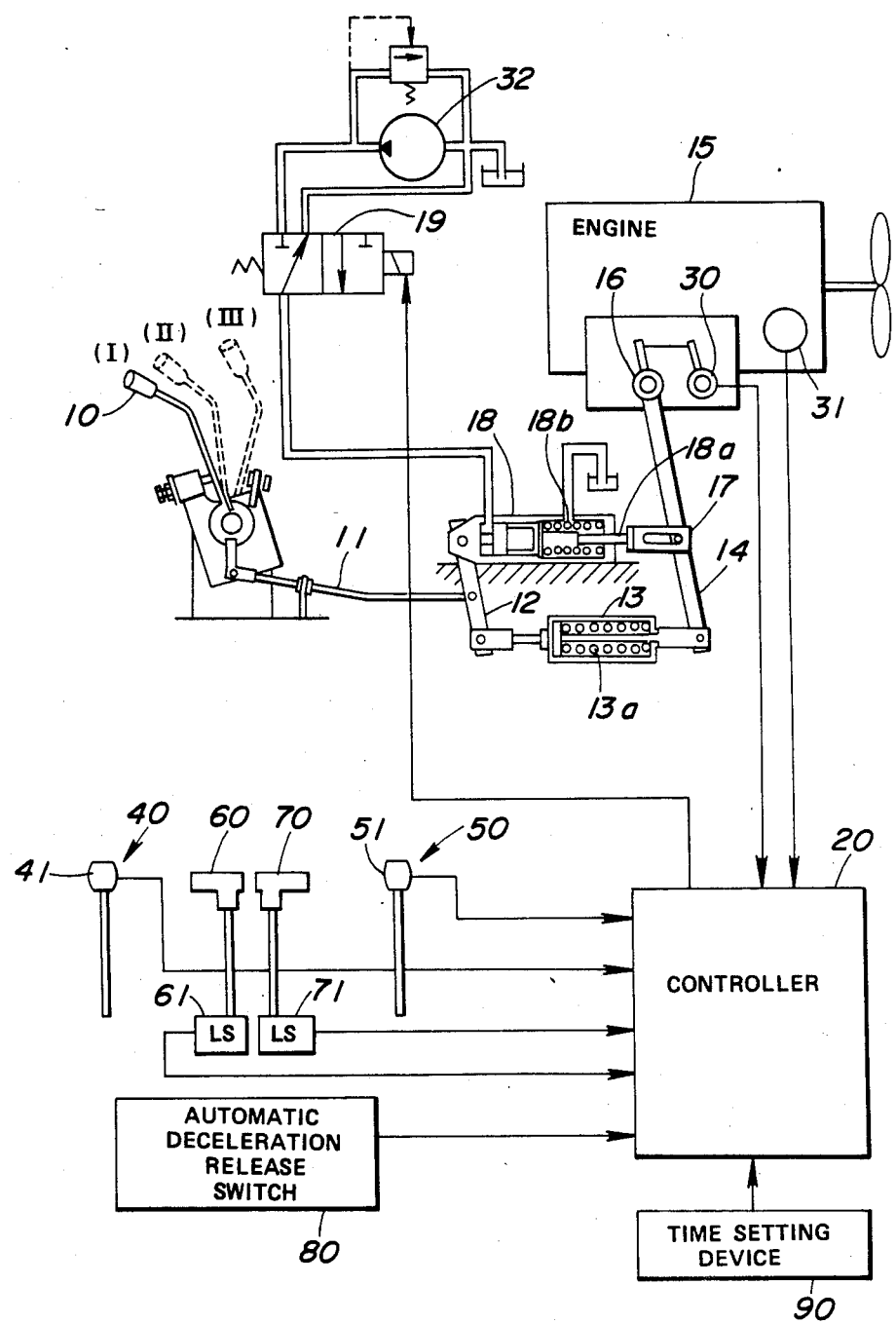
FIG. 1 is a system configuration of an apparatus in accordance with an embodiment of the present invention.

FIG. 1 is a systematic view illustrating the case where the apparatus of the invention is applied to a construction machine such as power shovel or the like adapted to be operated in such a manner that construction work is conducted while the number of revolutions of an engine is maintained at a level of large number of idle rotations. As is apparent from the drawing, a fuel adjustment lever 10 assumes a stop position (1).

Actuation of the fuel adjustment lever 10 is transmitted to a governor 16 via a link mechanism rods 11, 12, a cylinder 13 with a loose spring 13a incorporated therein and a lever 14. The engine 15 is adapted to control the number of revolutions corresponding to a feed rate of fuel which is injected in dependence on the position where the governor 16 has assumed. Incidentally, the stop position (1) where the fuel adjustment lever 10 is located represents a position where no fuel is fed under the action of the governor 16. Further, other position (II) of the lever as identified by dotted lined represents an idling position, while another position (III) of the same as identified by dotted lines does a high idleing position.

The lever 14 is pivotally connected to a piston rod 18a of a deceleration cylinder 18 at the middle part thereof via a yoke 17 with an elongated hole formed thereon. The deceleration cylinder 18 is controlled by means of a solenoid valve 19 which is adapted to be turned on or off with the aid of a controller 20 which will be described later. While it is kept in the operative state, it is so operated that the turning operation of the governor 16 is returned to an automatic deceleration position (position where the engine is rotate at the smaller number of revolutions than at the high idle position). It should be noted that details of operations of the deceleration cylinder 18 will be described later.

A potentiometer 30 detects the current turning position of the governor 16 and a signal representative of the turning position of the same is outputted to the controller 20. A rotation sensor 31 detects the current number of revolutions of the engine 15 and a signal representative of the number of revolutions of the same is outputted to the controller 20. Further, a time setting device 90 is adapted to set delay time as measured from the time when the inoperative state of the construction machine is detected until function of the automatic deceleration device is initiated (starting of function of deceleration) and a signal representative of the aforesaid delay time which has been preset manually is outputted to the controller 20.

On the other hand, operation control levers 40 and 50 on the construction machine are provided with grip sensors 41 and 51 each of which includes a detection portion adapted to response to approach or contact of fingers of an operator in the grip portion and a signal representative of whether or not there takes place an approach or contact of fingers transmitted from the grip sensors 41 and 51 to the controller 20. In the case of the illustrated embodiment, a power shovel is employed as construction machine and the control lever 40 commands turning movement of the upper turning section of the construction machine in the rightward or leftward direction by actuation thereof in the forward or backward direction and moreover commands extension or retraction of the arm by actuation of the same in the leftward or rightward direction, while the control lever 50 commands upward or downward displacement of the boom by actuation thereof in the forward or backward direction and moreover commands extension or retraction of the bucket by actuation of the same in the leftward or rightward direction.

Left-hand or right-hand running levers 60 and 70 are provided with limit switches 61 and 71 adapted to be turned on or off in accordance with actuation of the levers 60 and 70 and a signal (signal which becomes "1" in response to actuation) representative of whether the limit switches 61 and 71 are actuated or not is transmitted to the controller 20. Further, a signal (signal which becomes "1" in response to release of automatic deceleration) representative of whether or not function of automatic deceleration should be initiated by shifting of an automatic deceleration switch 80 is transmitted from the automatic deceleration release switch 80 to the controller 20.

Figure 2:
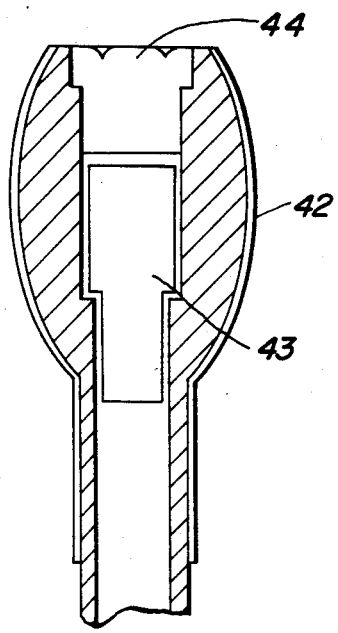
FIG. 2 is a fragmental vertical sectional view of a control lever with a grip sensor incorporated therein.

Next, description will be made below as to how the grip sensors 41 and 51 are constructed. However, due to the fact that both the grip sensors 41 and 51 are constructed in the same structure, description will be made below only as to the structure of the grip sensor 41 for the purpose of simplification. FIG. 2 is a fragmental vertical sectional view of the control lever in which the grip sensor is incorporated.

As will be readily apparent from the drawing, the grip sensor 41 is designed in the form of an electrical capacitance type proximity switch which includes an electrode 42 as a detecting portion. The electrode 42 is placed over the gripping portion of the control lever in the electrically insulated state. Further, the grip sensor 41 includes a sensor circuit to be described later which is incorporated in the gripping portion of the control lever and a push switch 44 is disposed in the embedded state at the upper part of the gripping portion of the control lever.

Figure 3:
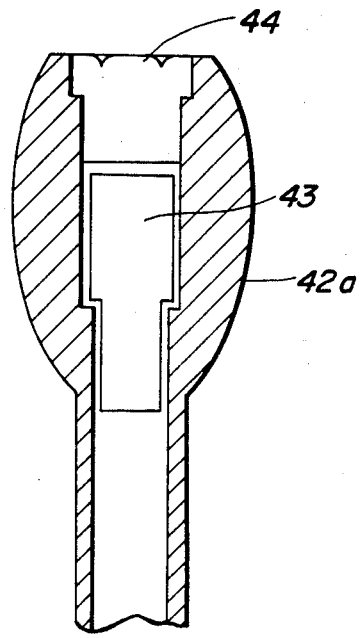
FIG. 3 is a fragmental vertical sectional view of another type of control lever with a grip sensor incorporated therein.

FIG. 3 is a fragmental vertical sectional view of a control lever, particularly illustrating other embodiment where the gripping portion of the control lever itself serves as an electrodes 42a. It should be noted that the electrode 42a also is electrically insulated from the sensor circuit 43.

Figure 4:
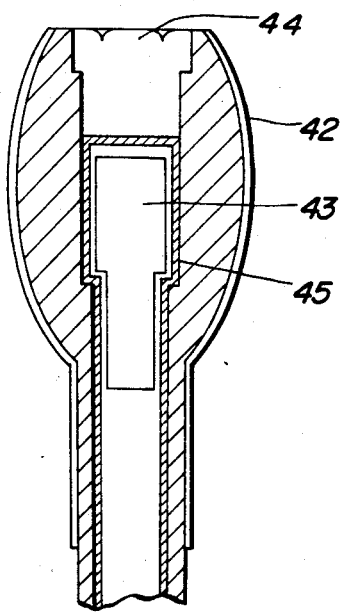
FIG. 4 is a fragmental vertical sectional view of a control lever similar to FIG. 1 with another type of grip sensor incorporated therein

FIG. 4 is a fragmental vertical sectional view of a control lever, particularly illustrating another embodiment where it is additionally provided with a shielding member 45 for the purpose of reducing effect of noise generated by the push switch 43 on function of the sensor circuit 43 and moreover remarkably improving directionality of the grip sensor.

Next, description will be made below as to function of the grip sensor 41 with reference to FIG. 4 which schematically illustrates the structure of the sensor circuit 43 by way of a circuit diagram.

Specifically, the sensor circuit 43 includes an oscillating circuit 46, a detecting circuit 47 and a Schmidt circuit 48 as essential components. The oscillating circuit 46 is so constructed that oscillating is effected when capacitance between the electrode 42 and the earth exceeds a certain level due to approach of fingers of an operator toward the electrode 42 or contact of the former with the latter caused by actuation of the control lever. A signal oscillated by the oscillating circuit 46 is rectified in the form of direct current signal while it is transmitted through the detecting circuit 47 and thereafter thus rectified signal is applied to the Schmidt circuit 48. The Schmidt circuit 48 is adapted to output a signal "1" when input voltage is raised up above a certain level (threshold value) and outputs a signal "0" when it is lowered below it. Accordingly, the Schmidt circuit 48 outputs a signal "1" in the above-mentioned case but when fingers are displaced away from the electrode 42 and thereby the oscillating circuit 46 stops its oscillation, resulting in output voltage from the detecting circuit 47 being reduced, a signal "0" is outputted therefrom.

Figure 6:
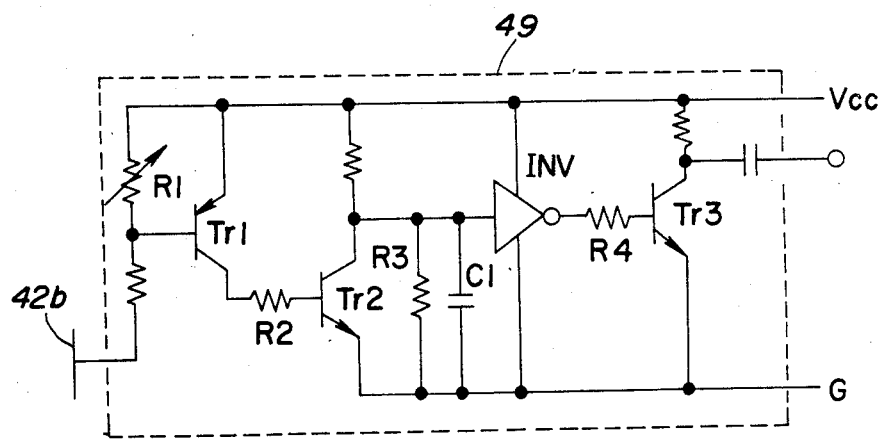
FIG. 6 is a part of another type of circuit diagram for the grip sensor.

The illustrated embodiments are concerned with the case where an electrical capacitance type proximity switch is employed for the grip sensor. However, the present invention should not be limited only to this. Alternatively, an induction type proximity switch may be employed for the grip sensor. A fragmental circuit 49 constituting the sensor circuit employable for the induction type proximity switch is illustrated in FIG. 6.

When fingers of an operator approach toward the electrode 42b or come in contact with the latter and thereby inductive noise is introduced into the grip sensor from noise source (for instance, generator or the like mounted on construction machine) via the electrode 42b and the body of the operator, difference in high frequency potential is developed at both the ends of a high resistor R1 whereby collector current of a transistor Tr1 is caused to pulsate. The collector current of the transistor Tr1 is applied to the base of a transistor Tr2 via a resistor R2 whereby collector current of the transistor Tr2 also is caused to pulsate. This pulsated current caused in that way is filtered with the aid of a resistor R3 and a capacitor C1 and it is then subjected to shaping in respect of wave-form by means of an inverter INV. A signal outputted from the inverter INV is applied to a transistor Tr3 via a resistor R4 and it is then outputted from the transistor Tr3 after it is amplified therein. It should be noted that detection sensitivity can be adjusted as required by varying resistance value of the resistor R1.

Figure 5:
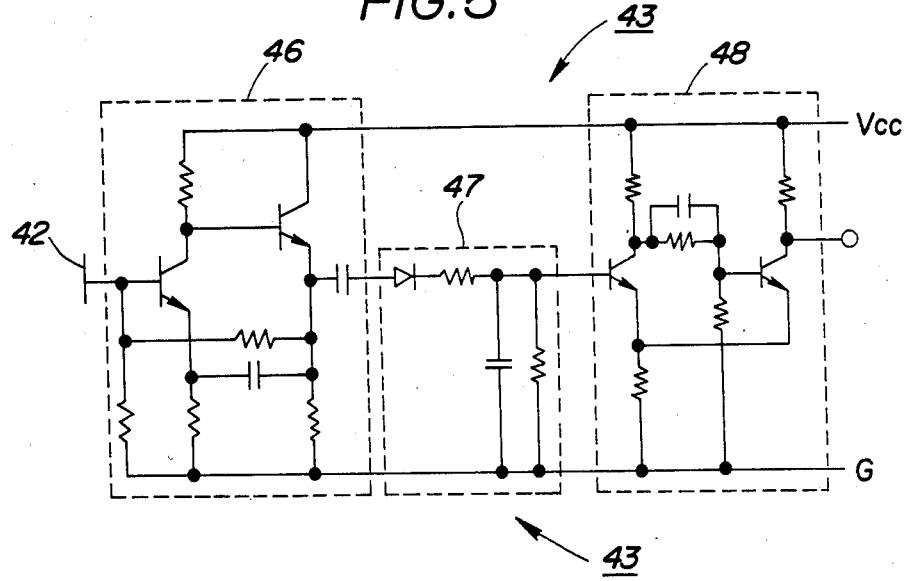
FIG. 5 is a circuit diagram for the grip sensor.

Output from the circuit 49 is applied to the detection circuit in quite the same manner as described with reference to FIG. 5 and output from the detection circuit is then applied to a Schmidt circuit. Incidentally, description of these circuits and the drawing on these circuits are omitted.

It should be added that the switch employed for the grip sensor may be designed in the form of a switch adapted to detect an occurrence of contact or failure of contact with reference to resistance value which varies in dependence on how fingers of an operator come in contact with the sensor.

Figure 7:
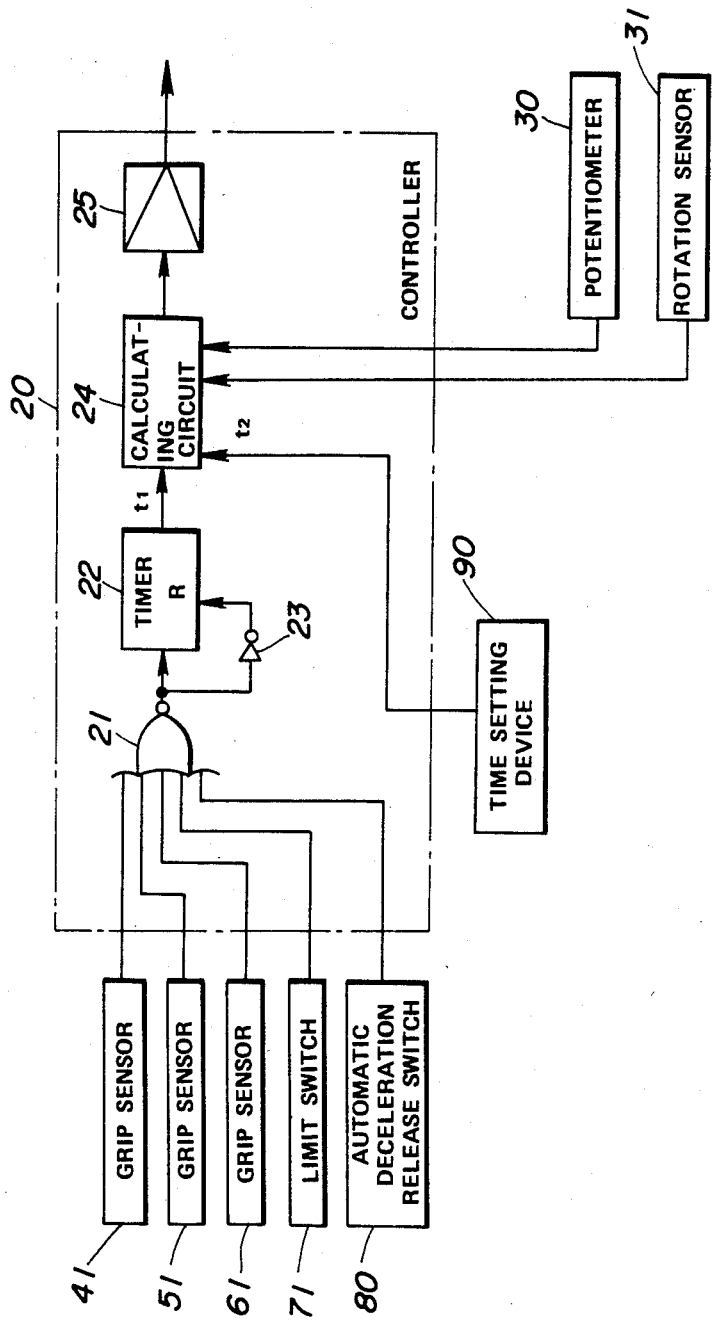
FIG. 7 is a block diagram illustrating the detailed structure of a controller in FIG. 1.

Outputs from each of the grip sensors 41 and 51, the limit switches 51 and 61 and the automatic deceleration release switch 80 are applied to a NOR circuit 21 in the controller 20 (see FIG. 7). Accordingly, the NOR circuit 21 outputs signal "1" representative of the inoperative state when all input signals are identified by "0".

A timer 22 is so designed that it becomes operative to measure time only when signal "1" is transmitted from the NOR circuit 21, and it becomes inoperative when signal "0" is transmitted thereto and it is then reset when signal "1" which is reversed by means of an inverter 23 is applied to its reset terminal R.

Output signal $t_1$ representative of time measured by means of the timer 22 is transmitted to a calculating circuit 24. The calculating circuit 24 is supplied with other inputs which comprise signals transmitted from the potentimeter 30 and the rotation sensor 31 to represent the position where the governor 16 is turned and signal representative of the current number of revolutions of the engine. Further, it is added with signal $t_2$ which is transmitted from a time setting device 90 to represent delay time as measured until deceleration is initiated.

Specifically, the calculating circuit 24 becomes operative only when the current number of revolutions of the engine as detected by means of the potentimeter 30 or the rotation sensor 31 is in excess of a predetermined number of revolutions of the engine which is caused to decrease under the action of the automatic deceleration device and it outputs deceleration signal via an amplifier 25 when an inequality of $t_1 > t_2$ is established as a result of comparison between signal $t_1$ inputted from the timer 22 and signal $t_2$ inputted from the time setting device 90, that is, when a period of time for which the inoperative state continues is longer than delay time as measured until deceleration is initiated.

Next, operation of the apparatus of the invention will be described below.

Figure 8:
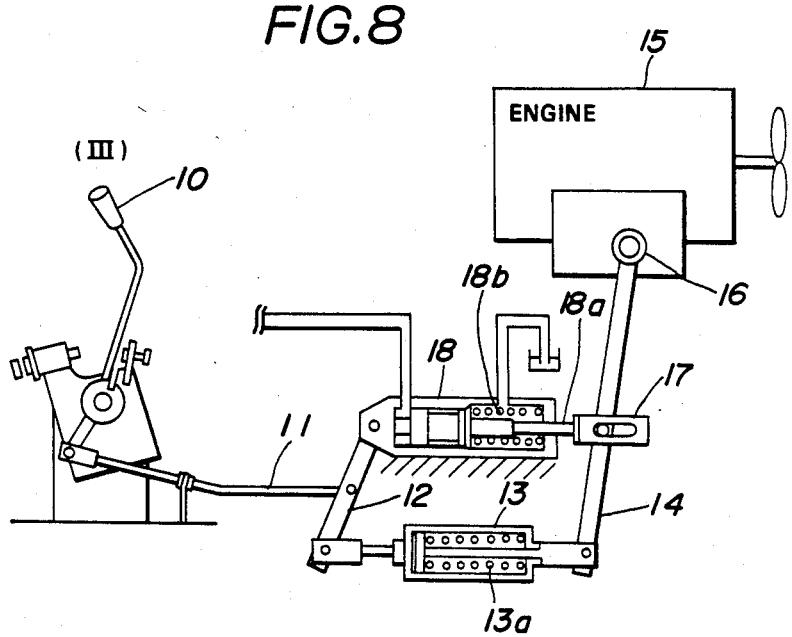
FIG. 8 is a fragmental systematic view of the apparatus of the invention, particularly illustrating the operative state thereof before an automatic deceleration device is operated.

First, it is assumed that the fuel adjusting lever 10 is located at the high idle position (III) as shown in FIG. 8. At this moment movement of the lever 14 is not mechanically restricted by means of the deceleration cylinder 18 because the yoke 17 is formed with an elongated hole.

When fingers of an operator are parted away from the control levers 40 and 50 for a period of time longer than $t_1$ as measured until deceleration is initiated, for instance, for the reason of waiting for arrival of a dump truck or the like reason, a deceleration signal as mentioned above is outputted from the controller 20. The solenoid valve 19 (see FIG. 1) is turned on in response to the deceleration signal and thereby pressurized hydraulic oil delivered from the hydraulic pump 32 is supplied to the deceleration cylinder 18 via the solenoid valve 19.

Figure 9:
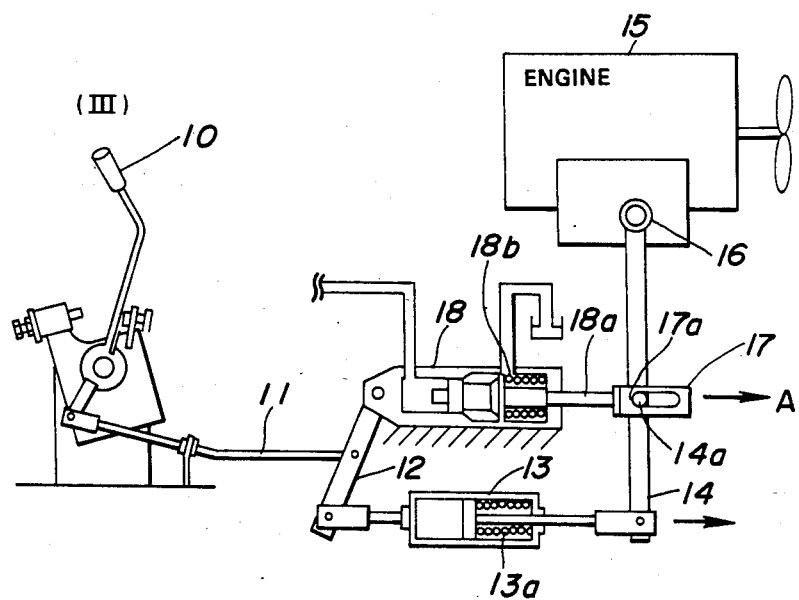
FIG. 9 is a fragmental systematic view similar to FIG. 8, particularly illustrating the operative state of the apparatus after the automatic deceleration device is operated.

This causes the piston rod 18a of the deceleration cylinder 18 to be extended as shown in FIG. 9 until the one end 17a of the elongated hole in the yoke 17 is engaged to a pin 14a on the lever 14 whereby the lever 14 is displaced in the direction as identified by an arrow mark A in the drawing.

Thus, the governor 16 is caused to turn to the automatic deceleration position with the result that the number of revolutions of the engine 15 is automatically decreased to the number of revolutions lower than that at the high idle operation. At this movement of the lever 14 is absorbed under the effect of resiliency of a loose spring 13a in the cylinder 13 whereby the rods 11 and 12 and the fuel adjustment lever 10 fail to be actuated.

It should be noted that the present invention should not be limited only to the above-mentioned hydraulic actuator which serves as driving means for reducing the number of revolutions of an engine in response to deceleration signal. Alternatively, other driving means such as pneumatic actuator, electric motor or the like may be employed, when it is confirmed that it functions in the same manner as the hydraulic actuator. Further, a push switch incorporated in the upper part of the gripping portion on each of the control levers may be so designed that the one part functions as a switch for sounding a horn tone and the other part thereof does as automatic deceleration release switch.

Figure 10:
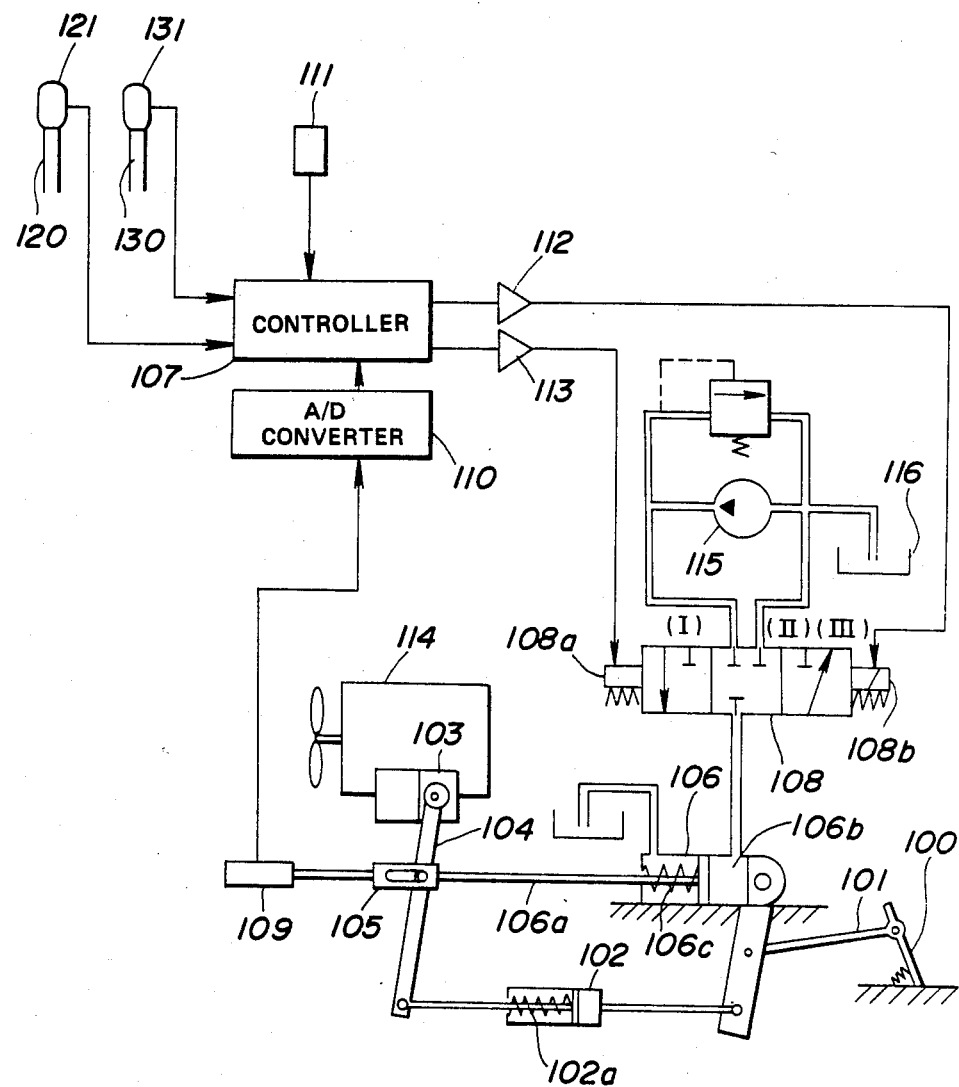
FIG. 10 is a systematic view illustrating an apparatus in accordance with other embodiment of the present invention.

FIG. 10 is a systematic view particularly illustrating the case where the apparatus of the invention is applied to a construction machine such as wheel loader or the like which is constructed in such a manner that the number of revolutions of engine is adjusted in dependence on an extent of depressing of an acceleration pedal.

As is apparent from the drawing, depressing operation of the acceleration pedal 100 is transmitted to a lever 104 pivotally connected to a governor 103 via a rod 101 and a cylinder 102 with a loose spring 102a accommodated therein.

The lever 104 is pivotally connected to a piston rod 106a of a cylinder 106 at the middle part thereof via a yoke 105 with an elongated hole formed thereon. The cylinder 106 is adapted to operate under the effect of pressurized hydraulic oil which is supplied from supply source via a solenoid valve 108 so as to turn the lever 104 in the clockwise or anticlockwise direction to increase or decrease the number of revolutions of the engine. Incidentally, the solenoid valve 108 is controlled in accordance with a signal which is transmitted from a controller 107 via amplifiers 112 and 113. Details as to how controlling is effected will be described later.

A potentiometer 109 detects the existent turning position of the lever 104 (corresponding to the current extent of depressing of the acceleration pedal) and a signal representative of the turning position is applied to the controller 107 via A/D converter 110.

The apparatus of the invention includes control levers 120 and 130 which serve to actuate working portions of the construction machine (bucket and lift arm on the wheel loader) and they are provided with grip sensors 121 and 131 in their gripping portion. Incidentally, the grip sensors 121 and 131 are designed in the same manner as the grip sensors 41 and 51 in FIG. 1 in such a manner that a signal representative of whether or not the body of an operator (fingers of the same) approaches toward them or comes in contact with them is transmitted to the controller 107. It should be noted that another signal is transmitted to the controller 107 from a cancel switch 111 adapted to cancel controlling for the number of revolutions of the engine according to the present invention.

Next, function of the controller 107 will be described below.

The controller 107 is adapted to output control signals to coils 108a and 108b via amplifiers 112 and 113 in order to receive signals from the grip sensors 121 and 131 and obtain an extent of automatic acceleration corresponding to the signals therefrom.

Now, it is assumed that extent of automatic acceleration is represented by A, intensity of output signal from the grip sensor 121 in the bucket control lever 120 is represented by $S_1$ and intensity of output signal from the grip sensor 131 in the lift arm control lever 130 is represented by $S_2$. The extent of automatic acceleration A is defined in accordance with the following formula.

$$A = K_1 S_1 + K_2 S_2 \qquad (1)$$

(where $S_1$ and $S_2$ are identified in the form of digital signal and $K_1$ and $K_2$ are identified in the form of analogue signal.)

It should be added that $K_1$ and $K_2$ are a weight coefficient respectively which is determined in dependence on kind of working tools such as bucket, lift arm or the like and moreover the above-mentioned coefficient is constant which is determined in dependence on a type of construction machine and performances of engine. It can be readily understood from this formula that an extent of automatic acceleration is obtained corresponding to kind of working tools to be actuated by an operator.

If it is assumed that an extent of acceleration is represented by the following formula at the time when the engine 114 is kept in the idle state $$A = 0$$

and an extent of acceleration is represented by the following formula at the time when the engine 114 is rotated at the rated number of revolutions, $$A = 10$$

both the weight coefficients $K_1$ and $K_2$ are determined as follows.

$K_1$ (bucket): 3
$K_2$ (lift arm): 2

This is attributable to the fact that actuation of the bucket is generally achieved with higher load.

Figure 11:
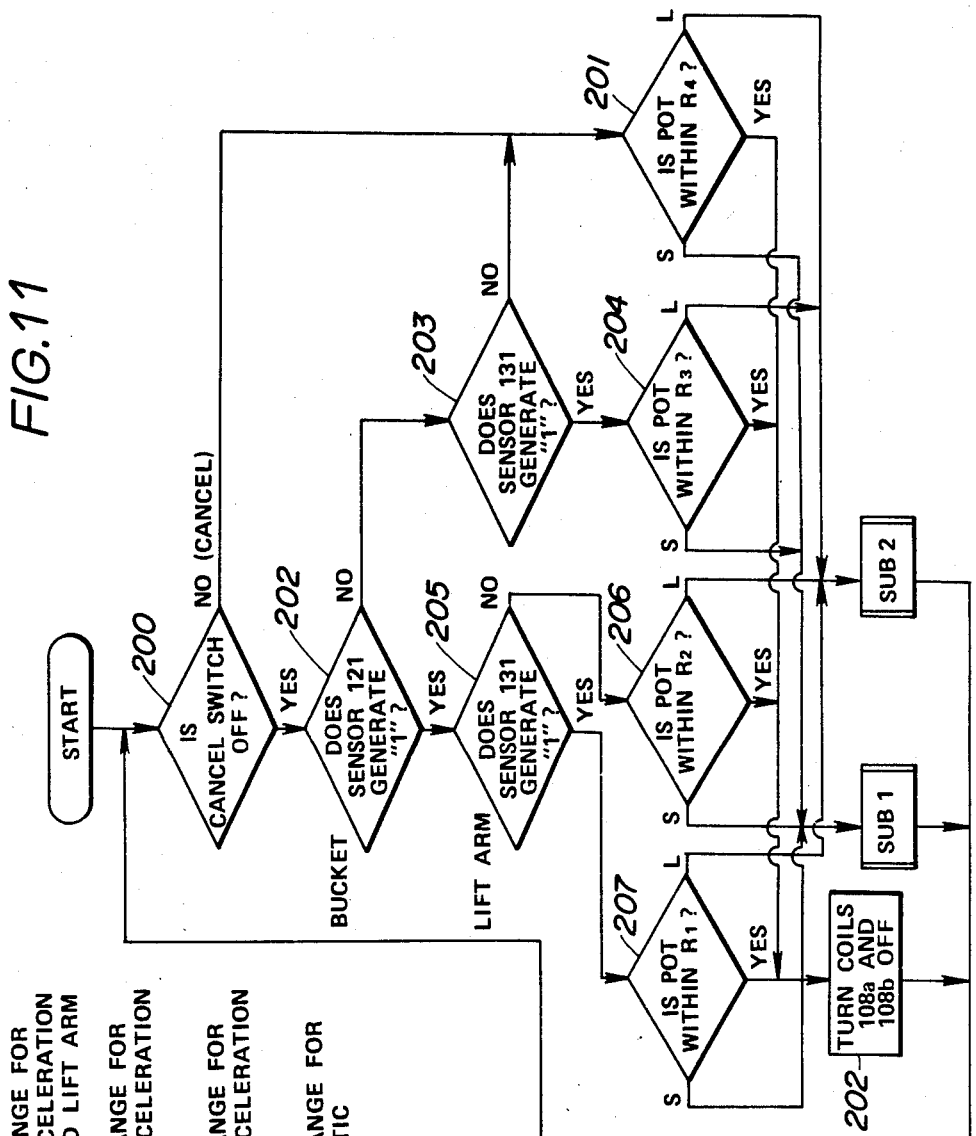
FIGS. 11 to 13 are a flow chart respectively, particularly illustrating functions of the controller in FIG. 10.
Figure 12:
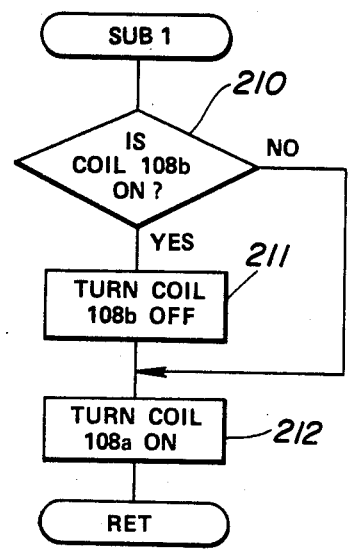
Figure 13:
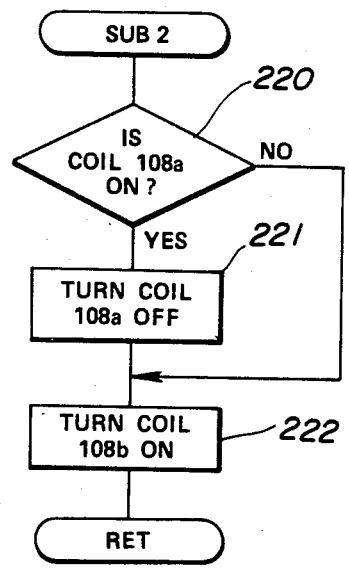

FIGS. 11 to 13 are flow chart respectively which schematically illustrates functions of the controller 107 in more details.

Referring to FIG. 11, it is first discriminated whether the cancel switch 117 is turned off or not (Step 200) and when it is found that it is turned on, Step 201 is executed.

During Step 201 it is discriminated whether or not an extent of automatic acceleration detected by means of the potentimeter 109 is maintained within the range of zero and when it is found that it is maintained within the allowable range as mentioned above, the coils 108a and 108b in the solenoid valve 108 are turned off (Step 202). In the case where an extent of automatic acceleration is less than the allowable range of zero, sub-routine 1 is executed (see FIG. 12), while in the case where it is more than the allowable range, Sub-routine 2 is executed (see FIG. 13).

During Sub-routine 1 it is discriminated whether the coil 108b in the solenoid valve 108 is turned on or not (Step 210) and when it is found that it is turned on, the coil 108a is turned on (Step 210) after the coil 108b is turned off (Step 211), while when it is found that the coil 108b is turned off, the coil 108a is turned on immediately. Namely, during Sub-routine 1 the solenoid valve 108 is shifted to Position (I) (see FIG. 1) whereby pressurized hydraulic oil is supplied to the cylinder 106 from the pump 115 via the solenoid valve 108 so as to allow the piston rod 106a to be extended. As a result, the number of revolutions of the engine is increased.

Further, during Sub-routine 1 it is discriminated whether the coil 108a in the solenoid valve 108 is turned on (Step 220) and when it is found that the coil 108a is turned on, the coil 108b is turned on (Step 222) after the coil 108a is turned off (Step 221), while when it is found that the coil 108a is turned off, the coil 108b is turned on immediately. Namely, during Sub-routine 2 the solenoid valve 108 is shifted to Position (II) whereby hydraulic oil in the hydraulic chamber 106a is discharged into a drain tank 116 via the solenoid valve 108 under the effect of resilient force of a return spring 106c in the cylinder 106. This causes the piston rod 106a in the cylinder 106 to be retracted, resulting in the number of revolutions of the engine being decreased.

When the cancel switch 111 is turned off, Step 202 is executed. During Step 202, it is discriminated whether the grip sensor 121 in the bucket control lever 120 outputs signal "1" or not. When it is found that the grip sensor 121 outputs signal "0", Step 203 is executed. During Step 203, it is discriminated whether the grip sensor 131 in the lift arm control lever 130 outputs signal "1" or not. When it is found that the grip sensor 131 also outputs signal "0", Step 201 is executed. During Step 201, the number of revolutions of the engine is controlled in the same manner in the case where the cancel switch is turned on in order that an extent of automatic acceleration is reduced to zero.

When it is found that the grip sensor 131 outputs signal "1" during Step 202, Step 204 is executed. During Step 204, the number of revolutions of the engine is controlled to assure an extent of automatic acceleration relative to actuation of the lift arm.

Further, when it is found that the grip sensor 121 outputs signal "1" during Step 202, Step 205 is executed. During Step 205, it is discriminated whether the grip sensor 131 in the lift arm control lever 130 outputs signal "1" or not.

When it is found that the grip sensor 131 outputs signal "0", Step 206 is executed. During Step 206, the number of revolutions of the engine is controlled so as to assure an extent of automatic acceleration relative to actuation of the bucket, while when it is found that the grip sensor 131 outputs signal "1", Step 207 is executed. During Step 207, the number of revolutions of the engine is controlled so as to assure an extent of automatic acceleration relative to actuation of both the bucket and the lift arm.

Figure 14:
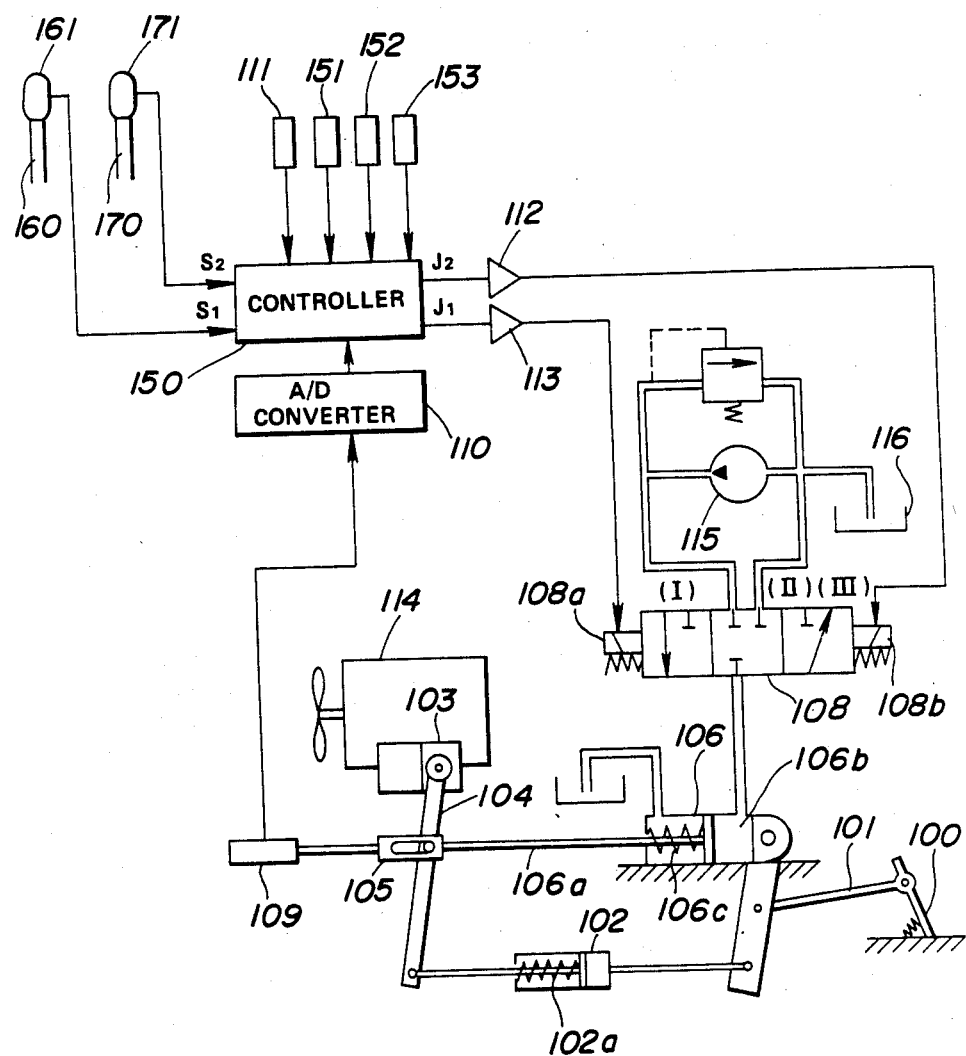
FIG. 14 is a systematic view illustrating an apparatus in accordance with another embodiment of the present invention.

FIG. 14 is a systematic view particularly illustrating the case where the apparatus of the invention is applied to a crane. Same or similar parts and components as those in FIG. 11 are identified by the same reference numerals but their detailed description will be omitted. It should be noted that substantial difference between the embodiment in FIG. 11 and that in FIG. 14 consists in a controller 150 and its input signals adapted to be inputted thereinto.

Specifically, the apparatus of the invention includes a grip sensor 161 incorporated in the gripping portion of a control lever 160 for raising and lowering a boom of the crane and a grip sensor 171 incorporated in the gripping portion of a control lever 170 for operating a winch. Each of the grip sensors 161 and 171 outputs to the controller 150 a signal representative of whether or not the body of an operator (fingers of the same) approaches toward it or comes in contact with it.

Figure 15:
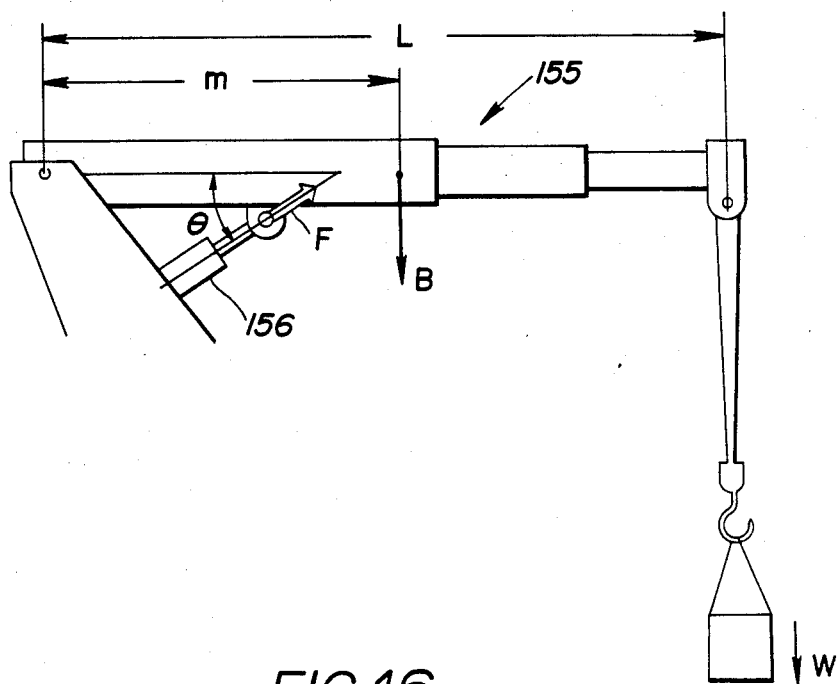
FIGS. 15 and 16 are fragmental view of a crane respectively, particularly illustrating constants and variables relative to each part on the crane.

Further, the apparatus of the invention includes a sensor 151 for sensing an angle of raising and lowering of the boom, a sensor 152 for sensing a length of the boom and a pressure sensor 153. These sensors 151, 152 and 153 detect an angle $\theta$ of raising and lowering of the boom 155, a length L of the boom 155 and bottom pressure $P_B$ and head pressure $P_H$ in a cylinder 156 which serves for raising and lowering the boom 155 as shown in FIG. 15 and signals representative of raising and lowering angle $\theta$, Length L, bottom pressure $P_B$ and head pressure $P_H$ are applied to the controller 150.

Figure 16:
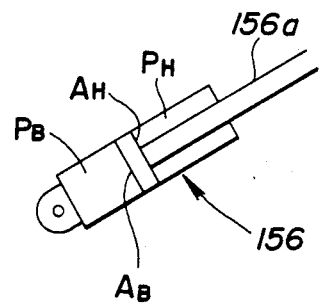

The controller 150 is so constructed that axial force F of the raising and lowering cylinder 156 is first obtained in accordance with the following formula with reference to bottom pressure $P_B$ and head pressure $P_H$.

$$F = P_B \cdot A_B - P_H \cdot A_H \quad (2)$$

where $A_B$: pressure receiving area on the bottom side of the piston rod 156a as seen in FIG. 16

$A_H$: pressure receiving area on the head side of the piston rod 156a

Next, hoisting load W is obtained in accordance with the following formula with reference to raising and lowering angle $\theta$, boom length L and axial force F.

$$W = \frac{F \times \theta - m \times B}{L} \quad (3)$$

where

B: dead weight of the boom m: arm length of moment caused by dead weight of the boom B, the arm length being a function of boom length L It should be noted that lifting load W may be obtained by detecting tension force of a hoisting wire.

Next, an extent of automatic acceleration Q is obtained in accordance with the following formula with reference to axial force F of the raising and lowering cylinder and lifting load W.

$$Q = k(a \cdot S_1 + b \cdot S_2) \quad (4)$$

where k: level adjusting coefficient

It should be noted that $S_1$ and $S_2$ represent a digital value in the form of "1" or "0" derived from output signal of the grip sensors 161 and 171 and a and b represent a weight coefficient corresponding to raising and lowering operation of the boom and winding operation of the winch. These coefficients a and b are previously stored as data in relation to boom length L, boom raising and lowering angle $\theta$, bottom pressure $P_B$ and others. Now, an example of data will be shown below on Table 1.

TABLE 1

| boom length L (m) | boom raising and lowering angle $\theta$ (degree) | cylinder head pressure $P_H$ (Kg/cm$^2$) | cylinder bottom pressure $P_B$ (Kg/cm$^2$) | lifting load W (ton) | a | b |
|---|---|---|---|---|---|---|
| 8.1 | 51.9 | 0 | 165.5 | 15.57 | 2.00 | 1.00 |
| 8.1 | 29.1 | 0 | 153.0 | 10.57 | 1.84 | 0.68 |
| 13.7 | 66.0 | 0 | 135.5 | 10.12 | 1.64 | 0.65 |
| 13.7 | 48.6 | 0 | 138.5 | 6.75 | 1.68 | 0.43 |
| 13.7 | 27.2 | 0 | 116.5 | 3.95 | 1.40 | 0.25 |
| 19.3 | 68.7 | 0 | 120.5 | 6.63 | 1.46 | 0.43 |
| 19.3 | 53.3 | 0 | 130.5 | 4.55 | 1.58 | 0.29 |
| 19.3 | 35.8 | 0 | 107.0 | 2.47 | 1.30 | 0.16 |

As will be readily apparent from the table, coefficient a is approximately in proportion to bottom pressure $P_B$ and coefficient b also is approximately in proportion to lifting load W.

Figure 17:
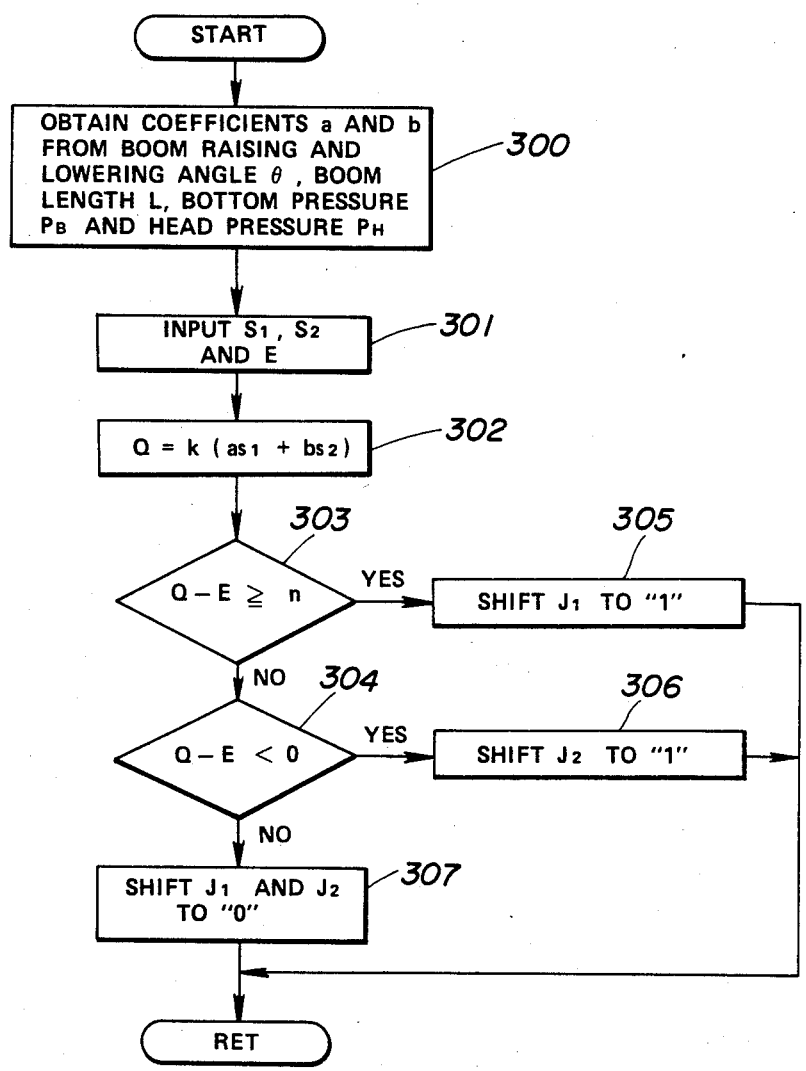
FIG. 17 is a flow chart illustrating functions of the controller in FIG. 14.

FIG. 17 is a flow chart which schematically illustrates how the controller 150 functions.

The controller 150 is so constructed that signals representative of boom raising and lowering angle $\theta$, boom length L, bottom pressure $P_B$ and head pressure $P_H$ are first inputted thereinto and axial force F of the cylinder 155 and hoisting load W are then obtained (refer to Formulae (2) and (3)). Next, coefficients a and b are obtained corresponding to axial force F and hoisting load W (Step 300).

Then, $S_1$, $S_2$ and E are inputted from the grip sensors 161 and 171 and the potentiometer 109 (Step 301) and thereafter an extent of automatic acceleration Q to be obtained as target value is calculated in accordance with Formula (4) (Step 302).

Next, a comparison is made between the target extent of automatic acceleration Q and the actual extent of automatic acceleration E (Steps 303 and 304). When an inequality of $Q - E \geq n$ (n: width of hystersis (constant)) is established, signal $J_1$ ("1") is outputted from the controller 150 (Step 305). When an inequality of $Q - E < 0$ is established, signal $J_2$ ("1") is outputted from the controller 150 (Step 306). Signal $J_1$ ("1") is amplified with the aid of an amplifier 113 and it is then applied to the coil 108a of the solenoid valve 108 whereby the solenoid valve 108 is shifted to Position (I) so as to allow the cylinder 106 to be extended (with the result that the number of revolutions of the engine is increased). On the other hand, signal $J_2$ ("1") is amplified with the aid of an amplifier 112 and it is then applied to the coil 108b of the solenoid valve 108 whereby the solenoid valve 108 is shifted to Position (III) so as to allow the cylinder 106 to be retracted (with the result that the number of revolutions of the engine is decreased).

When the number of revolutions of the engine is controlled in dependence on the target extent of automatic acceleration Q until it is located within the range as defined by an inequality $0 < Q - E \leq n$, each of signals $J_1$ and $J_2$ is shifted to "0" (Step 307).

In the above-described embodiment the lever 104 is pivotally connected to the piston rod 106a via the yoke 105 with an elongated hole formed thereon. Thus, the number of revolutions of the engine 114 can be increased further by depressing the acceleration pedal 100, even when the lever 104 is actuated by means of the cylinder 106.

In the embodiments as described above weighting is effected only with respect to raising and lowering operation of the boom and winding operation of the winch. However, the present invention should not be limited only to them. Alternatively, weighting may be effected with respect to extending operation of the boom, turning operation of the same or the like operation in order that an extent of automatic acceleration is controlled as required with reference to the result of weighting. Further, the number of revolutions of the engine may be increased to a predetermined level without any weighting being effected, when it is found that any one of the grip sensors is turned on.

While the present invention has been described above only with respect to a few preferred embodiments thereof, it should of course be understood that it should not be limited only to them but various changes or modifications may be made in any acceptable manner without departure from the spirit and scope of the invention as defined by the appended claims.

We claim:

1. An apparatus for controlling the number of revolutions of an engine of a construction machine in which said engine is operated at a constant high speed when working is performed, comprising:
   a grip sensor including an electrical capacitance type proximity switch incorporated in a gripping portion of a control lever adapted to control actuation of a working tool on the construction machine, said sensor adapted to detect the approach of an operator of the construction machine toward the gripping portion of said control lever;
   control means for outputting a deceleration signal in response to an output signal from the grip sensor when the operator does not approach the gripping portion in order to reduce the current number of revolutions of the engine to a level lower than the number of revolutions of the engine at said high speed; and
   driving means for reducing the number of revolutions of the engine to a level of the last-mentioned lower one in response to the deceleration signal from said control means.

2. An apparatus as defined in claim 1, where the control lever includes a push switch which is incorporated in the upper part of the gripping portion thereof.

3. An apparatus as defined in claim 2, wherein said push switch comprises a horn switch.

4. An apparatus as defined in claim 2, wherein said push switch comprises an automatic deceleration release switch.

5. An apparatus as defined in claim 1, wherein said control means measures a period of time for which the grip sensor fails to carry out detection in response to the output signal from the grip sensor which indicates that no detection is achieved and includes a timer for resetting a period of measuring time in response to the output signal from the grip sensor which indicates that no detection is achieved and a calculating circuit adapted to output a deceleration signal when it is found that a period of measuring time measured by means of said timer is longer than a predetermined period of time.

6. An apparatus as defined in claim 5, wherein said control means further includes a time setting device which is capable of manually adjusting said predetermined period of time.

7. An apparatus as defined in claim 1, wherein said driving means includes a yoke with an elongated hole formed thereon, said yoke being operatively engaged to a rod by means of which an extent of actuation of a fuel adjusting lever is mechanically transmitted to a governor on the engine via a loose spring, a cylinder operatively connected to the yoke to displace said rod via the yoke and a solenoid valve for controlling extension and retraction of said cylinder in response to the deceleration signal from the control means.

8. An apparatus for controlling the number of revolutions of an engine of a construction machine comprising:
   at least one grip sensor including an electrical portion of a corresponding control lever adapted to control actuation of a working tool of the construction machine, said grip sensor adapted to detect the approach of an operator toward the gripping portion of said control lever;
   control means adapted to output an acceleration signal in response to an output signal from the grip sensor when the operator approaches said gripping portion in order to raise the current number of revolutions of the engine to a level higher than the number of revolutions of the engine in an idle rotational state; and
   driving means for raising the number of revolutions of the engine to a level of the last-mentioned higher one in response to the acceleration signal from said control means.

9. An apparatus as defined in claim 8, wherein said construction machine is a wheel loader, and said control lever comprises a first control lever from controlling actuation of a bucket and a second control lever for controlling actuation of a lift arm.

10. An apparatus as defined in claim 8, wherein said control means is adapted to produce the acceleration signal with reference to a coefficient corresponding to types of working tools and an output signal from the grip sensor incorporated in said control lever.

11. An apparatus as defined in claim 8, wherein said construction machine is a crane, and said control lever comprises a first control lever for controlling raising and lowering movement of a boom and a second control lever for controlling winding operation of a winch.

12. An apparatus as defined in claim 11, wherein said control means includes a pressure sensor for detecting bottom pressure in a boom raising and lowering cylinder, means for obtaining lifting load, means for obtaining first and second coefficients in proportion to said bottom pressure and lifting load, and means for producing the acceleration signal with reference to output signal from the grip sensor in each of the first and second control levers and said first and second coefficients.

13. An apparatus as defined in claim 8, wherein said driving means includes a yoke with an elongated hole formed thereon, said yoke being operatively engaged to a rod by means of which an extent of actuation of a fuel adjusting lever is mechanically transmitted to a governor on the engine via a loose spring, a cylinder operatively connected to the yoke to displace said rod via the yoke and a solenoid valve for controlling extension and retraction of said cylinder in response to the acceleration signal from the control means.

14. An apparatus for controlling the number of revolutions of an engine of a construction machine in which said engine is operated at a constant high speed when working is performed, comprising:
   proximity sensing means incorporated in a gripping portion of a control lever adapted to control actuation of a working tool on said construction machine, said sensing means adapted to detect the approach of an operator of said construction machine toward said gripping portion of said control lever;
   control means for outputting a deceleration signal in response to an output signal from the grip sensor when the operator does not approach said gripping portion in order to reduce the current number of revolutions of the engine to a level lower than the number of revolutions of the engine at said high speed; and
   driving means for reducing the number of revolutions of the engine to said lower level in response to the deceleration signal from said control means.

15. An apparatus as defined in claim 14 wherein said proximity sensing means includes an electrical capacitance type proximity switch.

16. An apparatus as defined in claim 14, wherein said proximity sensing means includes an induction type proximity switch.

* * * * *

UNITED STATES PATENT AND TRADEMARK OFFICE
CERTIFICATE OF CORRECTION

PATENT NO.   : 4,792,052

DATED        : December 20, 1988

INVENTOR(S)  : Okuda, et al.

It is certified that error appears in the above-identified patent and that said Letters Patent is hereby corrected as shown below:

Column 2, Line 61, "n" should be --in--.

Column 13, Lines 61-66, "at least one grip sensor including an electrical portion of a corresponding control lever adapted to control actuation of a working tool of the construction machine, said grip sensor adapted to detect the approach of an operator toward the gripping portion of said control lever;" should be --at least one grip sensor including an electrical capacitance type proximity switch incorporated in a gripping portion of a corresponding control lever adapted to control actuation of a working tool of the construction machine, said grip sensor adapted to detect the approach of an operator toward the gripping portion of said control lever;--

Signed and Sealed this

Thirteenth Day of June, 1989

Attest:

DONALD J. QUIGG

*Attesting Officer*  *Commissioner of Patents and Trademarks*